United States Patent
Maeda et al.

(12) 
(10) Patent No.: US 6,388,737 B1
(45) Date of Patent: May 14, 2002

(54) EXPOSURE METHOD AND APPARATUS

(75) Inventors: Ryuji Maeda; Mitugu Uemura, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/522,445

(22) Filed: Mar. 9, 2000

(30) Foreign Application Priority Data

Mar. 15, 1999 (JP) .......................................... 11-069002

(51) Int. Cl.7 .......................... G03B 27/54; G03B 27/32; G03B 27/72; G02B 26/08
(52) U.S. Cl. .............................. 355/67; 355/32; 355/35; 359/196; 359/216
(58) Field of Search .............................. 355/32, 35, 43, 355/53, 67, 50; 250/234, 236; 359/204, 201, 196, 216; 219/121.7; 347/239

(56) References Cited

U.S. PATENT DOCUMENTS

| | | | | |
|---|---|---|---|---|
| 4,378,480 A | * | 3/1983 | Langhans | 219/121.7 |
| 4,477,182 A | * | 10/1984 | Takanashi et al. | 355/43 |
| RE33,931 E | * | 5/1992 | Whitney | 355/53 |
| 5,386,221 A | * | 1/1995 | Allen et al. | 347/239 |
| 5,654,817 A | * | 8/1997 | De Loor | 359/201 |
| 5,834,766 A | * | 11/1998 | Suhara | 250/234 |
| 6,069,723 A | * | 5/2000 | Aoki | 359/204 |
| 6,172,788 B1 | * | 1/2001 | Suzuki et al. | 359/204 |
| 6,229,594 B1 | * | 5/2001 | Inoue | 355/50 |

FOREIGN PATENT DOCUMENTS

| | | |
|---|---|---|
| JP | 2-299220 | 12/1990 |
| JP | 4-176114 | 6/1992 |
| JP | 7-86123 | 3/1995 |

* cited by examiner

*Primary Examiner*—Russell Adams
*Assistant Examiner*—Rodney Fuller
(74) *Attorney, Agent, or Firm*—Staas & Halsey LLP

(57) ABSTRACT

An exposure method and apparatus are provided. The exposure apparatus of the present invention includes a discontinuous exposure unit which discontinuously exposes the scan-end point in a first field to be scanned on an exposure substrate, and also discontinuously exposes the scan-start point in a second field to be scanned on the exposure substrate. The exposure substrate is moved so that the scan-end point in the first field and the scan-start point in the second field overlap with each other to form an intermediate area to be exposed. In the intermediate area, the exposure of the first field and the exposure of the second field are averaged to prevent a difference in width of the intermediate area. This effect can be achieved without prolonging the exposure time.

19 Claims, 10 Drawing Sheets

EXPOSURE METHOD AND APPARATUS

BACKGROUND OF THE INVENTION

1. Field of the Invention

The present invention generally relates to exposure methods and apparatuses, and, more particularly, to an exposure method and apparatus for patterning a panel such as a reticle or a flat panel display used in the photo process in semiconductor production.

With an exposure apparatus using laser beams, the area irradiated with beams in one scan is limited. The area exposed by one scan is called a field, and a pattern is formed by a plurality of continuously formed fields. To achieve high-precision production, it is necessary to reduce errors in intermediate areas between the fields and accommodate larger exposed areas.

2. Description of the Related Art

In a conventional laser exposure apparatus for patterning the panel of a flat panel display such as a plasma display panel, a laser beam is divided into a plurality of beam elements by a beam splitter. On-off control is performed on each laser beam by an optical modulator in accordance with exposure data. The on-off controlled laser beams are applied to a rotating polygon, and the laser beams reflected by the polygon are then applied to an exposure substrate via a condenser lens. The exposure substrate is scanned in synchronization with the rotation of the polygon.

As shown in FIG. 1, on a 42-inch plasma display panel (PDP), a vertical line (Y direction) can be drawn in one scan by a condenser lens having a diameter of 600 mm. Japanese Laid-Open Patent Application No. 7-35994 discloses such a laser exposure apparatus.

Japanese Laid-Open Patent Application No. 62-26819 discloses a laser exposure apparatus for reticle production. In the laser exposure apparatus, the patterned area on the exposure substrate is exposed twice, four times, or eight times, so as to improve the accuracy in patterning.

As plasma display panels have been becoming larger, the exposure substrates have also been becoming larger; from 42 inches to 55 inches, from 55 inches to 60 inches. To expose a 55-inch exposure substrate, for instance, a condenser lens having a diameter of 750 mm is necessary, as shown in FIG. 2. Even with the 600-mm condenser lens shown in FIG. 1, the resolution at the periphery of the lens is too low.

FIG. 3 shows the relationship between design rule and errors. As shown in the graph, the errors at the scan-start point and the scan-end point corresponding to the lens periphery are larger than the error in the scan center point corresponding to the center area of the lens. Accordingly, accurate patterning with a condenser lens having a diameter of 600 mm or larger is very difficult. Even if fields are continuously formed in the scanning direction, there might be deviations in the intermediate portions between the fields. FIG. 4A shows a case where a deviation is caused between two fields in a Y direction, and FIG. 4B shows a case where a deviation is caused in an X direction. It should be understood that the X-direction deviation and the Y-direction deviation might occur at the same time. FIG. 4C shows a case where a great difference in width is caused in the intermediate area between two fields.

The X-direction deviation and the Y-direction deviation can be corrected by a laser interferometer or an optical modulator to improve the accuracy. However, the difference in width is largely due to the resolution of the lens, and therefore is difficult to eliminate.

With the conventional exposure apparatus that exposes the exposure substrate several times, there is also a problem that the exposure time required by the exposure apparatus is several times longer than a normal exposure time.

SUMMARY OF THE INVENTION

A general object of the present invention is to provide exposure methods and apparatuses, in which the above disadvantages are eliminated.

A more specific object of the present invention is to provide an exposure method and an exposure apparatus which can prevent differences and irregularities in size and width of the intermediate area without prolonging the exposure time.

The above objects of the present invention are achieved by an exposure apparatus comprising: a rotatable polygon which reflects laser beams to an exposure substrate through a lens: and a discontinuous exposure unit which discontinuously exposes the scan-end point in a first field to be scanned on the exposure substrate, and discontinuously exposes the scan-start point in a second field to be scanned on the exposure substrate. Here, the exposure substrate is moved so that the scan-end point in the first field and the scan-start point in the second field overlap with each other to form an intermediate area.

With this structure, the exposure of the first field and the exposure of the second field are averaged in the intermediate area. Thus, differences and irregularities in width can be avoided in the intermediate area.

The above objects of the present invention are also achieved by an exposure apparatus comprising: a rotatable polygon which reflects laser beams to scan an exposure substrate through a lens; and a rotation unit which rotates the exposure substrate through an angle of 180° after a first field to be scanned on the exposure substrate is exposed. Here, a second field to be scanned on the exposure substrate is exposed after the exposure substrate is rotated through an angle of 180°, so that the scan-end point in the first field becomes continuous with the scan-start point in the second field.

With this structure, the scan-end point in the first field and the scan-start point in the second field can be exposed with the same part of a lens. Thus, differences in size and width due to irregular resolution of the lens can be prevented in the intermediate area.

The above objects of the present invention are also achieved by an exposure apparatus comprising: a rotatable polygon which reflects laser beams to scan an exposure substrate through a lens; a first lens which is used to expose a main pattern in the center of the exposure substrate in a scanning direction; and second and third lenses which are used to expose peripheral patterns adjacent to the scan-start point and the scan-end point, respectively, of the main pattern in the center of the exposure substrate.

With this structure, the exposure is performed with the center part of each lens. Thus, differences in size and width due to irregular resolution of the lens can be prevented in the intermediate area.

The above objects of the present invention are also achieved by an exposure method comprising the steps of:

irradiating an exposure substrate with laser beams reflected from a rotatable polygon through a lens;

discontinuously exposing the scan-end point in a first field to be scanned on the exposure substrate;

moving the exposure substrate so that the scan-end point in the first field and the scan-start point in a second field to be scanned overlap with each other to form an intermediate area to be exposed; and discontinuously exposing the scan-start point in the second field on the exposure substrate.

By this method, the exposure of the first field and the exposure of the second field are averaged. Thus, differences in size and width can be prevented in the intermediate area.

The above objects of the present invention are also achieved by an exposure method comprising the steps of:

irradiating an exposure substrate with laser beams reflected from a rotatable polygon through a lens;

exposing a first field to be scanned on the exposure substrate;

rotating the exposure substrate through an angle of 180°, so that the scan-end point in the first field becomes continuous with the scan-start point in a second field to be scanned on the exposure substrate; and exposing the second field on the exposure substrate.

By this method, the scan-end point in the first field and the scan-start point in the second field can be exposed with the same part of a lens. Thus, differences in size and width due to irregular resolution of the lens can be prevented in the intermediate area.

The above objects of the present invention are also achieved by an exposure method comprising the steps of:

irradiating an exposure substrate with laser beams reflected from a rotatable polygon through a lens;

exposing a main pattern in the center of the exposure substrate in a scanning direction with a first lens; and exposing peripheral patterns of the exposure substrate with second and third lenses, the peripheral patterns being adjacent to the scan-start point and the scan-end point, respectively, of the main pattern in the center of the exposure substrate.

By this method, the exposure is performed with the center part of each lens. Thus, differences in size and width due to irregular resolution of the lenses can be prevented in the intermediate area.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 1:
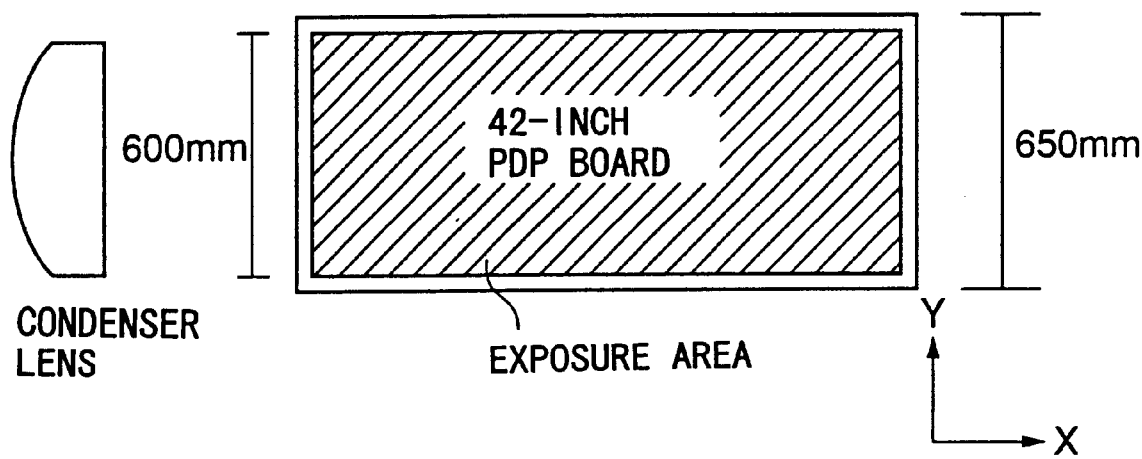
FIG. 1 shows a technique of patterning a plasma display panel of the prior art.
Figure 2:
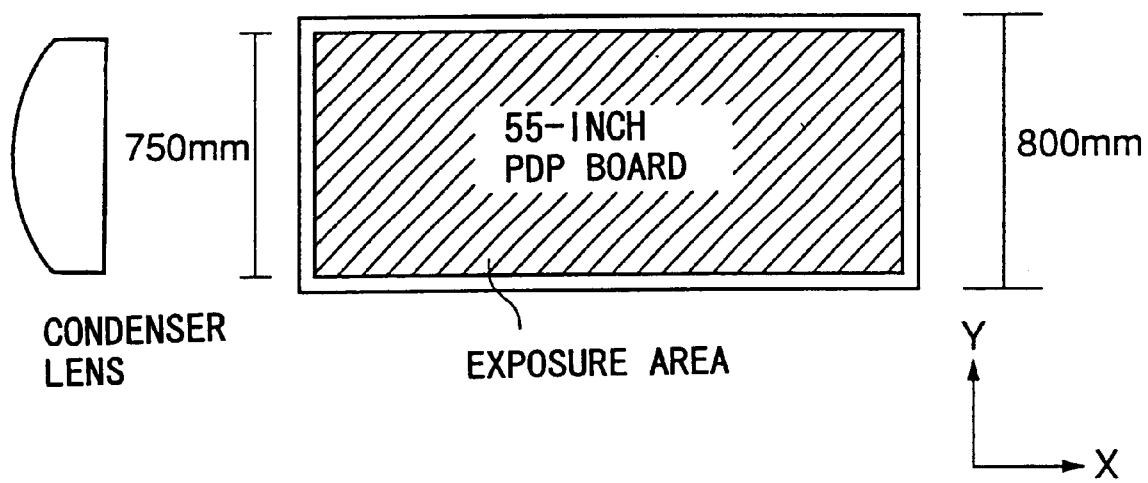
FIG. 2 shows a technique of patterning a plasma display panel of the prior art.
Figure 3:
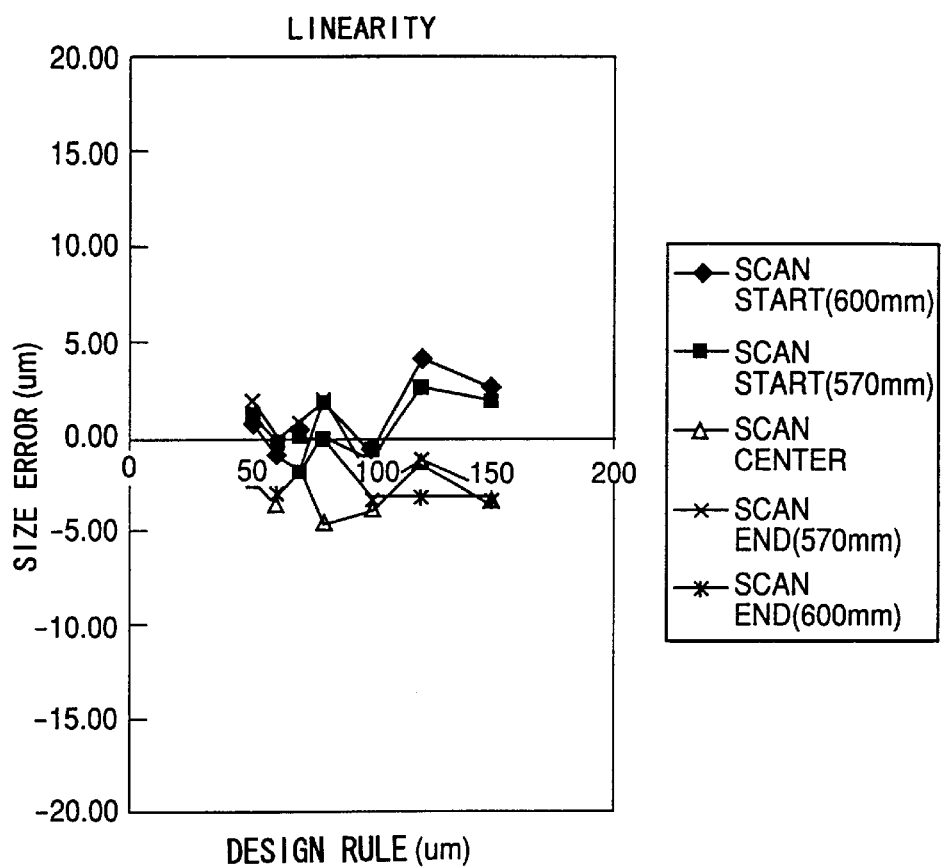
FIG. 3 shows the relationship between design rule and errors.
Figure 4A:
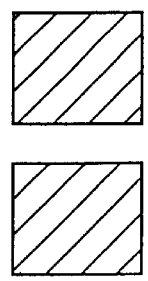
FIGS. 4A to 4C illustrate deviations caused in an intermediate area to be exposed.
Figure 4B:
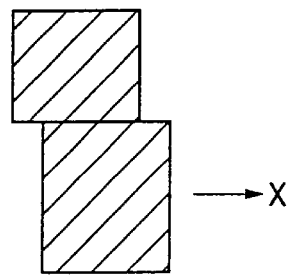
Figure 4C:
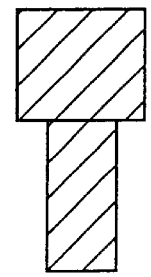
Figure 5:
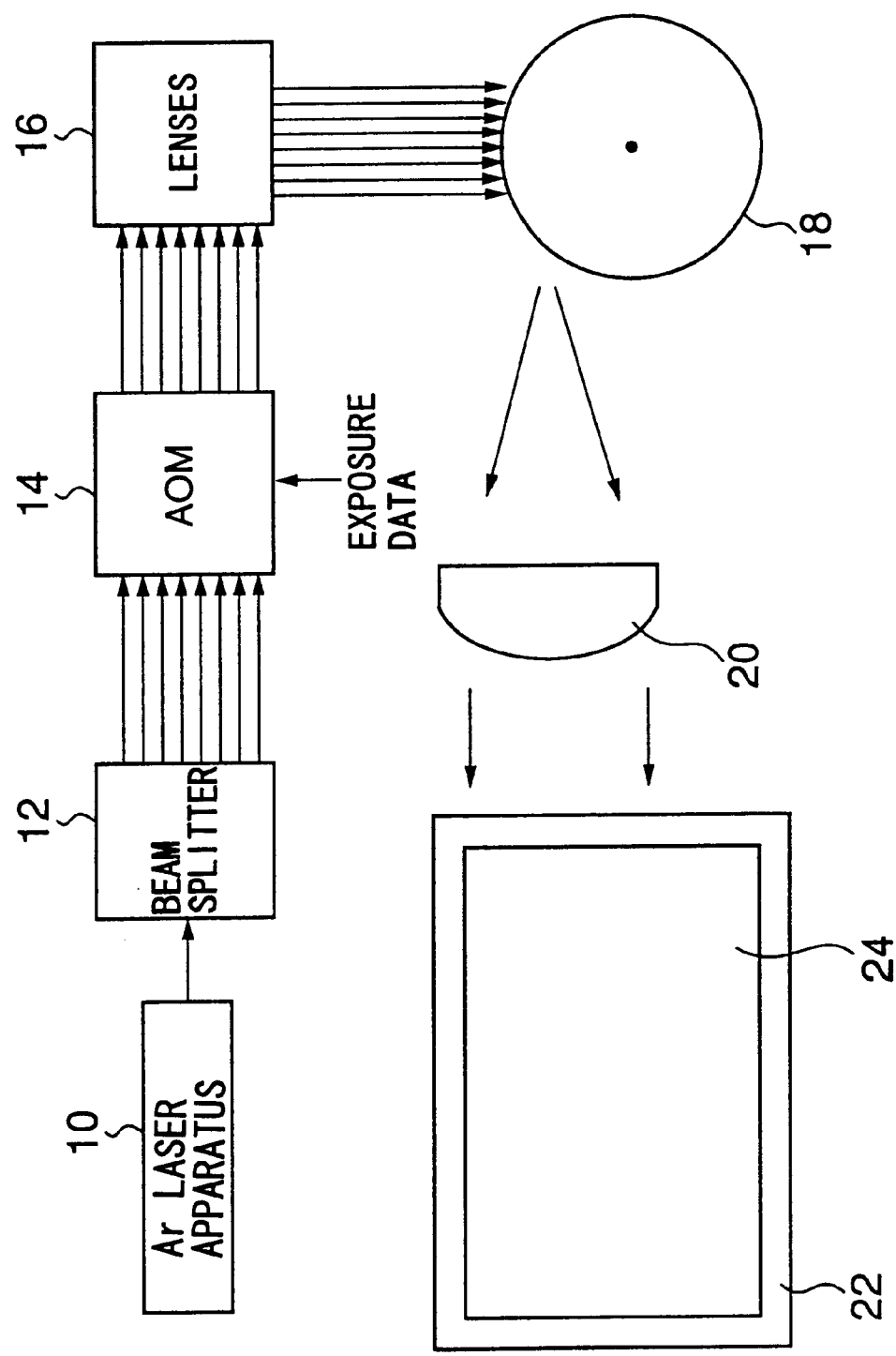
FIG. 5 is a block diagram of one embodiment of a laser exposure apparatus in accordance with the present invention.

FIG. 5 is a block diagram of one embodiment of a laser exposure apparatus in accordance with the present invention. This apparatus patterns a panel for a flat panel display such as a plasma display panel.

Figure 6:
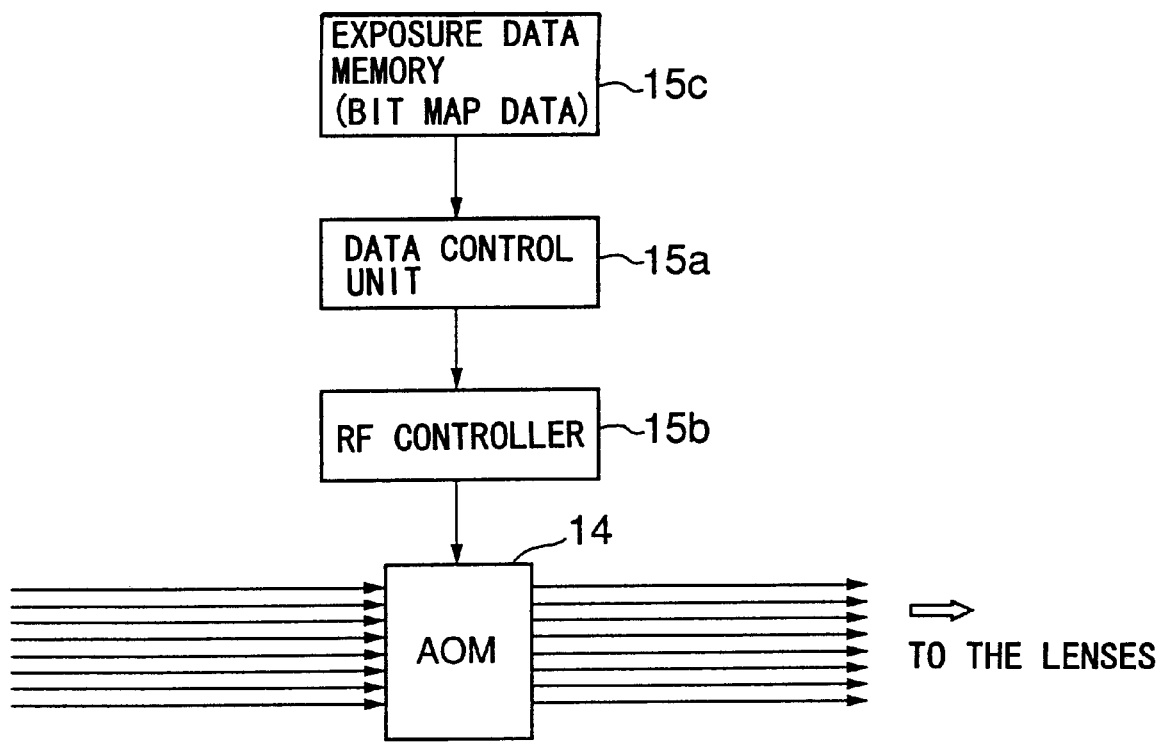
FIG. 6 is a block diagram of a laser beam on-off control process in accordance with exposure data.

As shown in FIG. 5, a laser beam emitted from an argon laser apparatus 10 is divided into light elements by a beam splitter 12, and on-off control is performed on each laser beam of the light elements by an acousto-optic modulator (AOM) 14 in accordance with exposure data. This process is shown in more detail in a block diagram of FIG. 6. A data control unit 15a reads the exposure data (bit map data) corresponding to each of the light elements from an exposure data memory 15c, and controls an RF controller 15b in accordance with the exposure data to generate an ultrasonic wave of the frequency corresponding to the exposure data for each light element. The ultrasonic waves are then supplied to the acousto-optic modulator 14, which deflects each of the light elements in accordance with the respective frequencies of the ultrasonic waves. Thus, on-off control can be performed on each of the light elements.

The laser beams controlled for each light flux are applied to a rotating polygon 18 via lenses 16. The laser beams reflected from the polygon 18 are then applied through a condenser lens 20 to an exposure substrate 24 placed on a stage 22, thereby scanning the exposure substrate 24 in synchronization with the rotation of the polygon 18. The scanning is performed by the use of the peripheral portion of the condenser lens 20 where the resolution is not very much reduced.

Figure 7A:
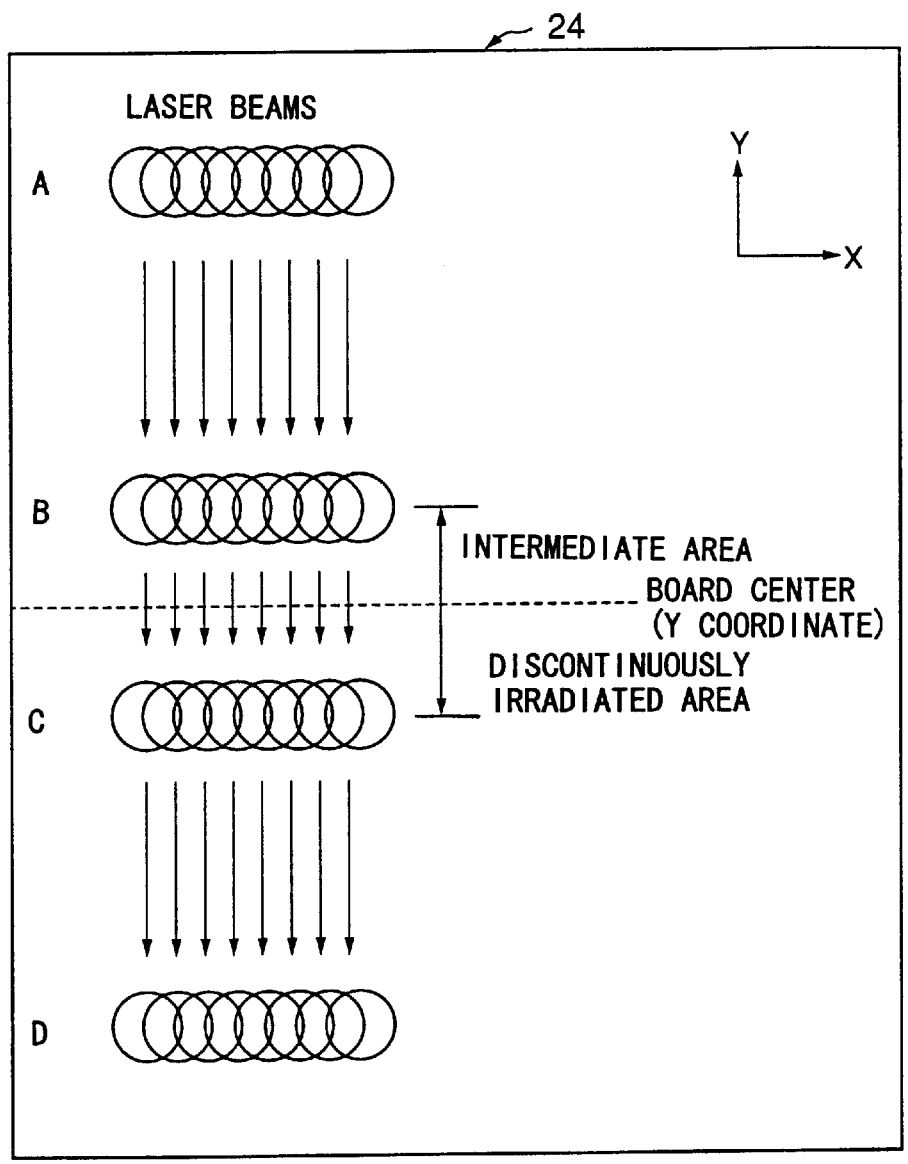
FIGS. 7A and 7B illustrate a first embodiment of an exposure method in accordance with the present invention.
Figure 7B:
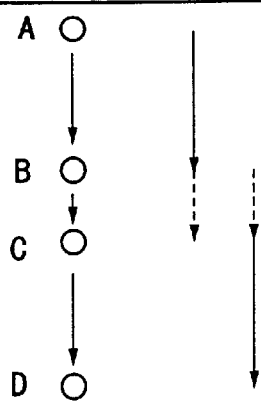

FIGS. 7A and 7B illustrate a first embodiment of an exposure method in accordance with the present invention. To pattern the exposure substrate 24 as shown in FIG. 7A, scanning is first performed from a point A to a point C in a Y direction by virtue of the rotation of the polygon 18, and the stage 22 is moved leftward in an X direction at constant speed so as to carry out first field exposure. The distance from the point A to the point C is determined by the diameter of the condenser lens 20, and the peripheral portion of the condenser lens 20, where the resolution is not much reduced, is used for the scanning.

As shown in FIG. 7B, the data control unit 15a uses normal exposure data (bit map data) to perform the on-off control for the acousto-optic modulator 14 from the point A to a point B. However, the data control unit 15a uses only the exposure data (bit map data) at odd numbers, for instance, to perform discontinuous on-off control for the acousto-optic modulator 14 from the point B to the point C.

The stage 22 is moved upward in the Y direction and then rightward in the X direction to the initial position. Scanning is next performed from the point B to a point D in the Y direction by virtue of the rotation of the polygon 18, and the stage 22 is moved leftward in the X direction to expose the next field. As shown in FIG. 7B, the data control unit 15a uses only the exposure data (bit map data) at even numbers to perform discontinuous on-off control for the acousto-optic modulator 14 from the point B to the point C. The data control unit 15a uses the normal exposure data to perform the on-off control for the acousto-optic modulator 14 from the point C to the point D.

Figures 8A, 8B:
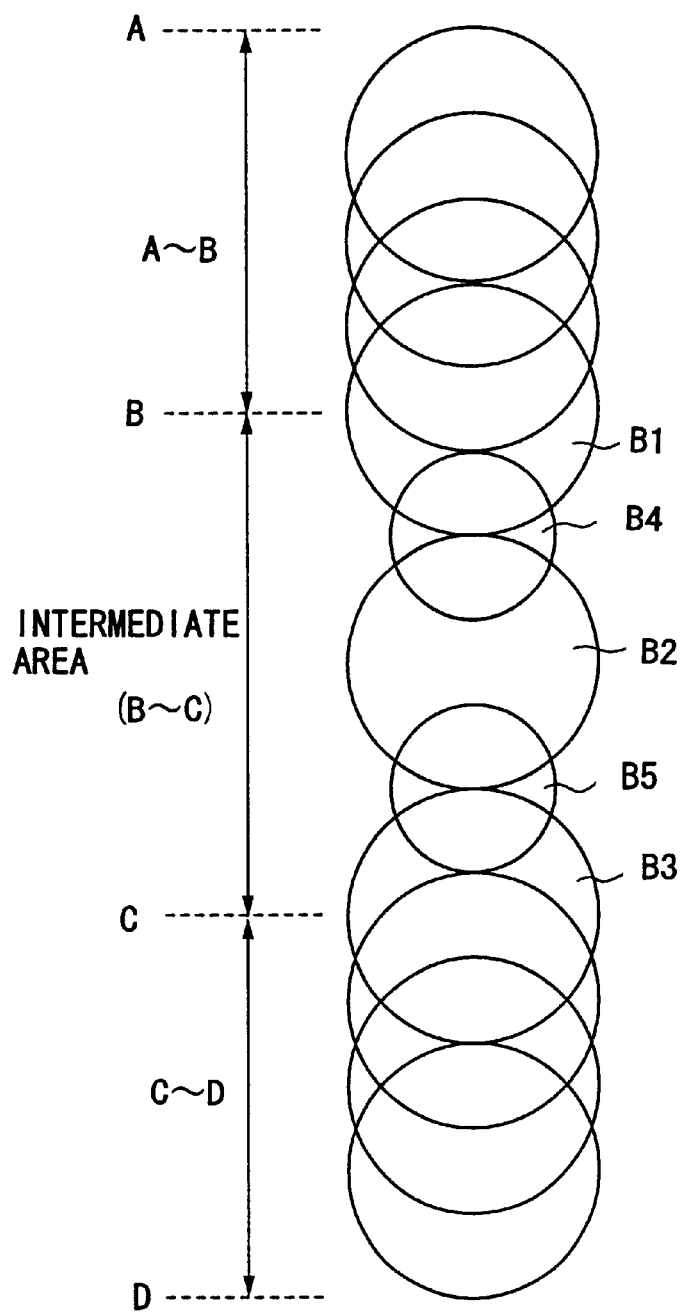
FIGS. 8A and 8B illustrate a beam irradiation state and a patterning state, respectively, in the first embodiment of the exposure method in accordance with the present invention.

Because of the properties of the condenser lens 20, the beam diameter at the scan-end point of the lens peripheral portion is the same as the lens center portion, but the beam diameter at the scan-start point is smaller than the lens center portion. In the method of this embodiment, the beam diameter of each of the beams B1, B2, and B3 has a normal size at the scan-end point of the scan between the point A and the point C, i.e., in the intermediate region between the point B and the point C, as shown in FIG. 8A. Even if the beam diameter of each of the beams B4 and B5 becomes small at the scan-start point of the scanning between the point B and the point D, i.e., the intermediate region between the point B and the point C, the beams B1 to B5 are averaged so that the patterned resist does not become too much narrower than the normal resist width in the intermediate region, as shown in FIG. 8B.

Figures 9A, 9B:
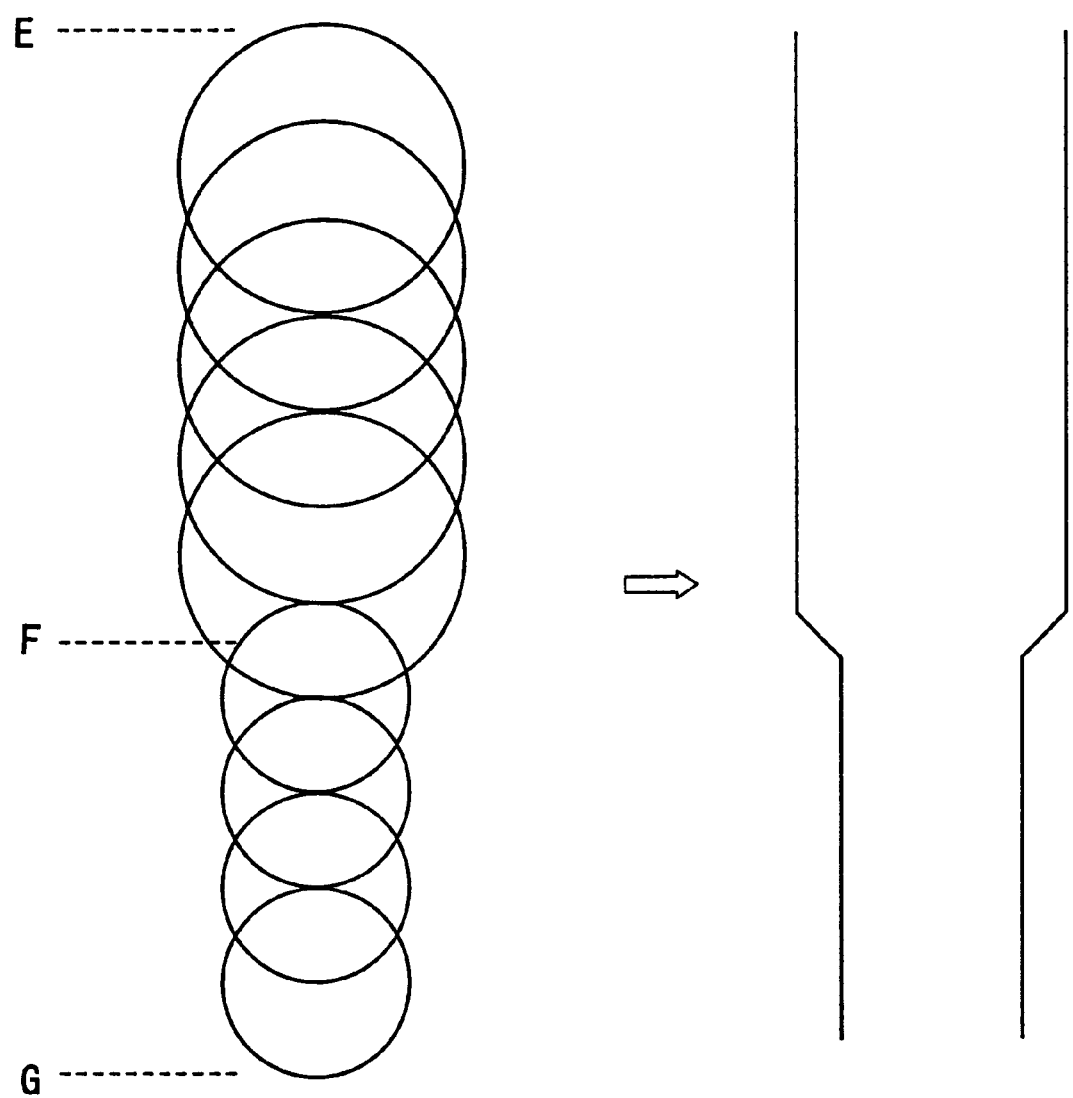
FIGS. 9A and 9B illustrate a beam irradiation state and a patterning state, respectively, in the prior art.

In the conventional exposure method, however, the beam diameter at the scan-end point of the scanning between a point E and a point F has a normal size, as shown in FIG. 9A. However, the beam diameter becomes smaller at the scan-start point of the scanning between the point F and a point G. As a result, the patterned resist has a narrow portion between the point F and the point G, as shown in FIG. 9B.

Figure 10:
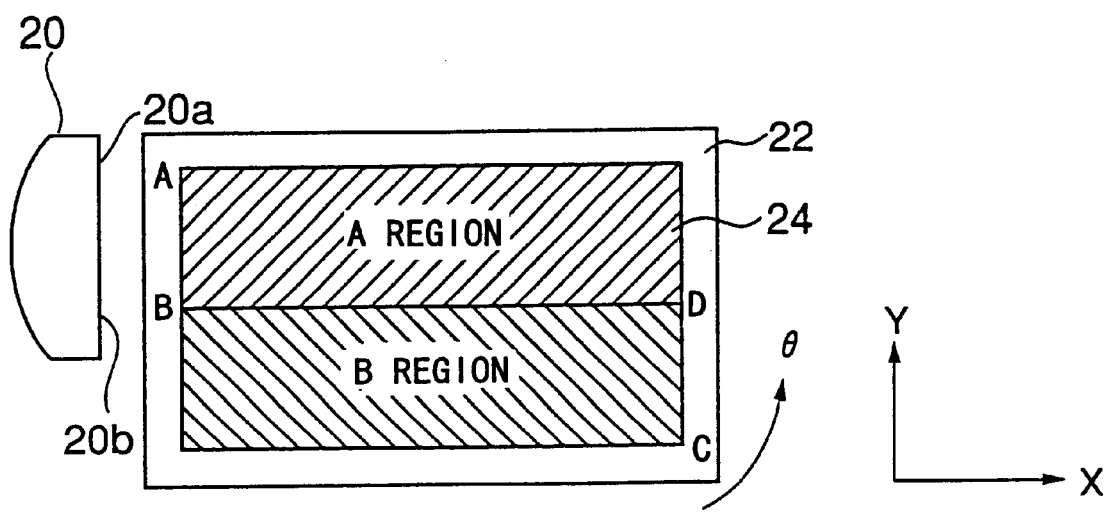
FIG. 10 illustrates a second embodiment of the exposure method in accordance with the present invention.
Figure 11:
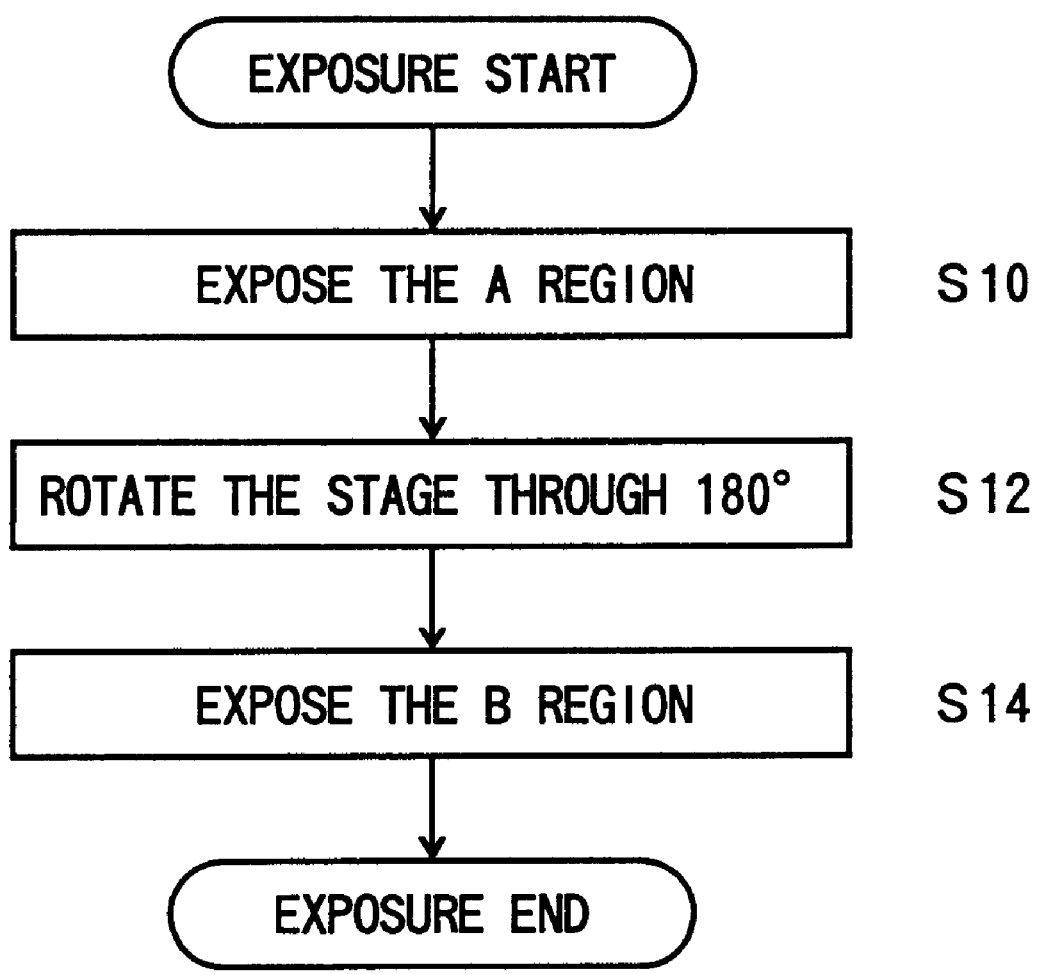
FIG. 11 is a flowchart of the second embodiment of the exposure method in accordance with the present invention.

FIG. 10 illustrates a second embodiment of the exposure method of the present invention, and FIG. 11 is a flowchart of the exposure method.

To pattern the exposure substrate 24 shown in FIG. 10, scanning is first performed from the point A to the point B in the Y direction by virtue of the rotation of the polygon 18, and the stage 22 is moved leftward in the X direction at a constant speed to expose an A region (first scanned field) in step S10. The distance from the point A to the point B is determined by the diameter of the condenser lens 20. The peripheral portion of the condenser lens 20, which does not have reduced resolution, is used for the scanning. From the position A to the position B, on-off control is performed for the acousto-optic modulator 14 in accordance with the regular exposure data.

Next in step S12, the stage 22, on which the exposure substrate 24 is fixed, is rotated through an angle of 180° in the direction of an arrow θ, so that points C and D of a B region on the exposure substrate 24 are positioned to the points A and B, respectively, of the A region.

In step S14, scanning is performed from the point C to the point D in the Y direction by virtue of the rotation of the polygon 18, and the stage 22 is moved leftward in the X direction at a constant speed to expose the B region (second scanned field). On-off control is then performed for the acousto-optic modulator 14 in accordance with the regular exposure data from the point C to the point D. Here, the exposure data should be rearranged in the scanning direction or the stage moving direction, or the reading order should be in conformity with the scanning direction or the stage moving direction.

If the beam diameter at the scan-start point 20a is different from the beam diameter at the scan-end point 20b on the periphery of the condenser lens 20, the boundary area between the A region and the B region is exposed at the scan-end point 20b of the condenser lens 20 to expose the A region of the exposure substrate 24. To expose the B region of the exposure substrate 24, the boundary area between the A region and the B region is also exposed at the scan-end point 20b of the condenser lens 20. Accordingly, the resolution of the condenser lens 20 is constant in the boundary area between the A region and the B region of the exposure substrate 24. Thus, differences in resist width due to the difference in lens resolution can be avoided.

To pattern a panel of a flat panel display such as a plasma display panel, the main display pattern in the center of the exposure substrate in the scanning direction is used as a display pattern region, and the peripheral areas adjacent to the scan-start point and the scan-end point of the main display pattern in the center are used as wiring pattern regions. In such an embodiment, there are two groups of the acousto-optic modulator 14, the lenses 16, the polygon 18, and the condenser lens 20, all of which are shown in FIG. 5. The first group is used to expose the display pattern region, while the second group is used to expose the wiring pattern regions.

Figure 12:
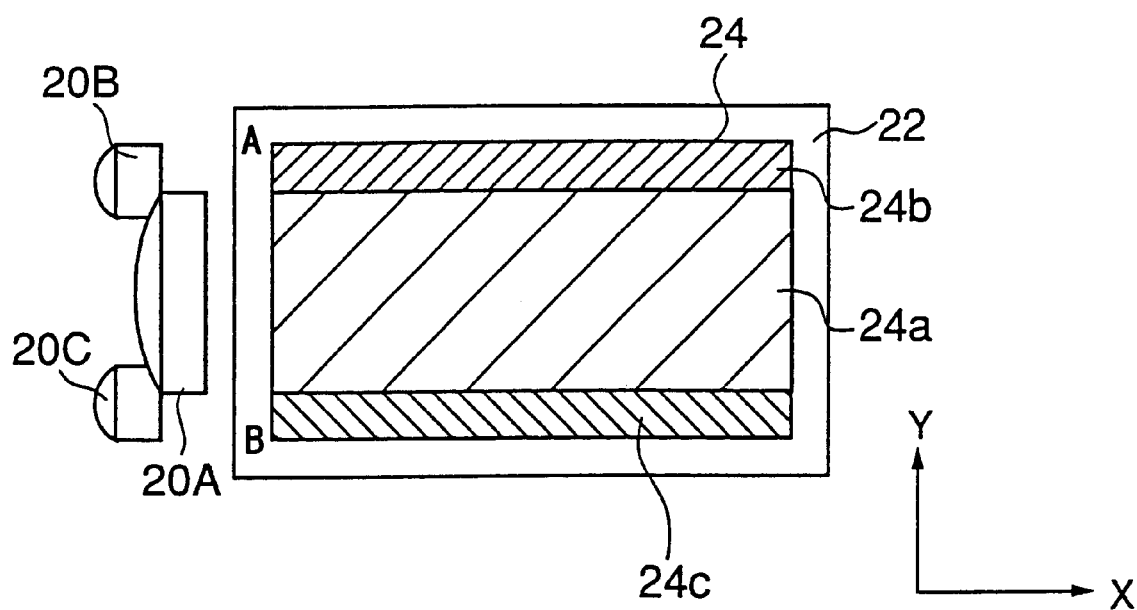
FIG. 12 illustrates a third embodiment of the exposure method in accordance with the present invention.

FIG. 12 illustrates this embodiment (third embodiment) of the exposure method in accordance with the present invention. FIG. 12 shows second-group condenser lenses 20B and 20C adjacent to a first-group condenser lens 20A for exposing a display pattern region 24a. The condenser lenses 20B and 20C are used to expose wiring pattern regions 24b and 24c. The condenser lenses 20B and 20C are shifted from the condenser lens 20A in the X direction.

First, the display pattern region 24a is exposed with the use of the condenser lens 20A, and the wiring pattern regions 24b and 24c are then exposed with the use of the condenser lenses 20B and 20C, respectively. Here, the obtained exposure data is divided into the data of the display pattern region 24a and the data of the wiring pattern regions 24b and 24c. The condenser lenses 20A to 20C may be integrally fixed to each other. Exposure is performed with the use of the center of each lens, where the resolution is substantially uniform.

As a further embodiment of the present invention, scanning is performed from the point A to the point B in the Y direction by virtue of the rotation of the polygon 18 of each of the first and second groups, and the stage 22 is moved leftward in the X direction at constant speed, so that the condenser lenses 20A to 20C expose the display pattern region 24a in the center of the exposure substrate 24 in the scanning direction and the wiring pattern regions 24b and 24c adjacent to the display pattern region 24a. The timing of the acousto-optic modulation by the exposure data of the display pattern and the timing of the acousto-optic modulation by the exposure data of the wiring patterns are adjusted to each other, depending on the deviation between the arranged positions of the first-group condenser lens 20A and the second-group condenser lenses 20B and 20C. Here, the exposure data is divided into the data of the display pattern region 24a and the data of the wiring pattern regions 24b and 24c.

In this embodiment, the display pattern region 24a and the wiring pattern regions 24b and 24c are exposed with the use of the center of each of the condenser lenses 20A to 20C, where the resolution is substantially uniform. Accordingly, the resolution of each lens is substantially constant at each boundary between the display pattern region 24a and the wiring pattern regions 24b and 24c. Thus, differences and irregularities in resist width can be prevented.

The present invention is not limited to the specifically disclosed embodiments, but variations and modifications may be made without departing from the scope of the present invention.

The present application is based on Japanese priority application No. 11-069002, filed on Mar. 15, 1999, the entire contents of which are hereby incorporated by reference.

What is claimed is:

1. An exposure apparatus comprising:
   a rotatable polygon which reflects a plurality of laser beams to an exposure substrate through a lens; and
   a discontinuous exposure unit which exposes a first field with a scan-end point on the exposure substrate during a first pass, and exposes a second field with a scan start point on the exposure substrate during a second pass, wherein the scan-end point in the first field and
   the scan-start point in the second field overlap to form an intermediate area that is exposed during the first pass and the second pass.

2. The exposure apparatus as claimed in claim 1, wherein the discontinuous exposure unit exposes the exposure substrate in the intermediate area in accordance with exposure data at a first reduced interval during the first pass, and exposes the exposure substrate in the intermediate area in accordance with the exposure data at a second interval during the second pass that fills in the spaces created during the first pass.

3. The exposure apparatus as claimed in claim 1, further comprising:
   a rotation unit which rotates the exposure substrate 180° after the first pass.

4. The exposure apparatus as claimed in claim 1, further comprising:
   a first lens that exposes a main pattern in the center of a field on the exposure substrate in a scanning direction; and
   a second lens and a third lens that expose peripheral patterns, adjacent to the main pattern.

5. An exposure apparatus comprising:
   a rotatable polygon which reflects a plurality of laser beams to an exposure substrate through a lens; and
   a rotation unit which rotates the exposure substrate 180° after a first field on the exposure substrate is exposed in a first pass, wherein a second field on the exposure substrate is exposed in a second pass after the exposure substrate is rotated 180° and a scan-end point in the first field is continuous with a scan-start point in the second field.

6. The exposure apparatus as claimed in claim 5, further comprising:
   a first lens that exposes a main pattern in the center of a field on the exposure substrate in a scanning direction; and
   a second lens and a third lens that expose peripheral patterns, adjacent to the main pattern.

7. An exposure apparatus comprising:
   a rotatable polygon which reflects a plurality of laser beams to scan an exposure substrate through a plurality of lenses, comprising;
      a first lens that exposes a main pattern in the center of a field on the exposure substrate in a scanning direction; and
      a second lens and a third lens, smaller than the first lens, that expose peripheral patterns, adjacent to the main pattern.

8. The exposure apparatus as claimed in claim 7, further comprising:
   a discontinuous exposure unit which exposes a first field, that includes the main pattern and the peripheral patterns with a scan-end point on the exposure substrate during a first pass, and exposes a second field with a scan start point on the exposure substrate during a second pass, wherein the scan-end point in the first field and the scan-start point in the second field overlap to form an intermediate area that is exposed during the first pass and the second pass.

9. The exposure apparatus as claimed in claim 8, wherein the discontinuous exposure unit exposes the exposure substrate in the intermediate area in accordance with exposure data at a first reduced interval during the first pass, and exposes the exposure substrate in the intermediate area in accordance with the exposure data at a second interval during the second pass that fills in the spaces created during the first pass.

10. The exposure apparatus as claimed in claim 7, further comprising:
    a rotation unit which rotates the exposure substrate 180° after the first pass.

11. An exposure method comprising:
    irradiating a first field with a scan end point on an exposure substrate with a plurality of laser beams reflected from a rotatable polygon through a lens;
    moving the exposure substrate so that the scan-end point in the first field and a scan-start point in a second field overlap to form an intermediate area; and
    irradiating the second field with the scan-start point on the exposure substrate.

12. The exposure method as claimed in claim 11, wherein the intermediate area is exposed in accordance with exposure data at a first reduced interval during the irradiating of the first field, and the scan-start point in the second field is irradiated in accordance with the exposure data at a second interval that fills in the spaces created during the first pass.

13. The exposure method as claimed in claim 11, wherein the moving further comprises:
    rotating the exposure substrate 180°.

14. The exposure method as claimed in claim 11, wherein the irradiating the first and second field further comprises:
    exposing a main pattern with a first lens; and
    exposing a plurality of peripheral patterns with second and third lenses, the peripheral patterns being adjacent to the main pattern.

15. An exposure method comprising:
    irradiating an exposure substrate with a plurality of laser beams reflected from a rotatable polygon through a lens;
    exposing a first field with a scan-end point on the exposure substrate;
    rotating the exposure substrate 180°, so that the scan-end point in the first field becomes continuous with a scan-start point in a second field to be scanned on the exposure substrate; and
    exposing the second field on the exposure substrate.

16. An exposure method comprising:
    irradiating an exposure substrate with a plurality of laser beams reflected from a rotatable polygon through a plurality of lenses;
    exposing a main pattern of the exposure substrate in a scanning direction with a first lens; and
    exposing a plurality of peripheral patterns, smaller than the main pattern, of the exposure substrate with second and third lenses, the peripheral patterns being adjacent to the main pattern.

17. The exposure method as claimed in claim 16, wherein the irradiating further comprises:
  irradiating a first field with a scan end point on an exposure substrate with a plurality of laser beams reflected from a rotatable polygon through a lens;
  moving the exposure substrate so that the scan-end point in the first field and a scan-start point in a second field overlap to form an intermediate area; and
  irradiating the second field with the scan-start point on the exposure substrate.

18. The exposure method as claimed in claim 17, wherein the moving further comprises:
  rotating the exposure substrate 180°.

19. The exposure method as claimed in claim 17, wherein the intermediate area is exposed in accordance with exposure data at a first reduced interval during the irradiating of the first field, and the scan-start point in the second field is irradiated in accordance with the exposure data at a second interval that fills in the spaces created during the first pass.

* * * * *